United States Patent [19]

Yamaguchi

[11] Patent Number: 5,091,770

[45] Date of Patent: Feb. 25, 1992

[54] SEMICONDUCTOR DEVICE HAVING A CERAMIC PACKAGE

[75] Inventor: Ichiro Yamaguchi, Yokohama, Japan

[73] Assignee: Fujitsu Limited, Kawasaki, Japan

[21] Appl. No.: 700,777

[22] Filed: May 16, 1991

[51] Int. Cl.⁵ .................... H01L 23/02; H01L 21/44
[52] U.S. Cl. .......................... 357/74; 357/80;
                                              437/180; 437/209; 437/218
[58] Field of Search ............... 357/74, 80; 437/180,
                                              437/209, 218

[56] References Cited

U.S. PATENT DOCUMENTS 5,019,535  5/1991  Wojnarowski et al. ............ 357/80

Primary Examiner—Edward J. Wojciechowicz
Attorney, Agent, or Firm—Staas & Halsey

[57] ABSTRACT

A semiconductor device comprises a package body of a ceramic material formed with a stage region for supporting a semiconductor chip and an interconnection region used for external interconnection of the semiconductor device, a semiconductor chip mounted on the stage region of the package body by a layer of a resin that fixes the semiconductor chip on the stage region, an interconnection lead provided on the interconnection region of the package body for external connection of the semiconductor device, an interconnection wire connecting a bonding bad region of the semiconductor chip and the interconnection lead electrically, and a zone of modified surface texture formed on a surface of the package body at a part located between the semiconductor chip and the interconnection region, wherein the zone has a texture with increased density as compared to the rest of the package body.

6 Claims, 4 Drawing Sheets

SEMICONDUCTOR DEVICE HAVING A CERAMIC PACKAGE

BACKGROUND OF THE INVENTION

The present invention generally relates to semiconductor devices and more particularly to a semiconductor device having a ceramic package.

With the demand for reducing the cost of semiconductor devices, use of cheap die-bonding processes that use the conductive epoxy resin, instead of conventional aluminum-silicon braze, for bonding a semiconductor chip on a package, is spreading.

When such an epoxy resin is used for porous ceramic packages, there occurs a phenomenon called bleeding, wherein the epoxy resin penetrates into the ceramic package by the capillary phenomenon.

FIG. 1 shows a conventional ceramic package in which a semiconductor chip 5 is mounted on a depressed mounting stage part 2 of a ceramic package by a layer of a conductive epoxy resin 6. In FIG. 1, the semiconductor chip 5 has a bonding pad 4 on its upper surface, and the bonding pad 4 is connected to an interconnection lead 10 fixed on the package 1 via a bonding wire 9.

In such a structure, it is generally inevitable that a penetration or bleeding of the epoxy resin forming the layer 6 occurs such that the epoxy resin penetrates more or less into the porous ceramic package 1 as shown by a region 8. Usually, such a penetration of the resin is limited to the region within the depressed stage part 2 and does not cause any serious problem. However, it is observed that such a bleeding 8 extends occasionally beyond the stage part 2 into the region of the package 1 that surrounds the stage part 2 as shown by a region 8a. It should be noted that the region of the package 1 that surrounds the stage part 2 is provided with the interconnection lead 10, and the resin that have caused the bleeding 8a covers the interconnection lead 10. When such a coverage of the interconnection lead 10 by the resin 8a occurs, the electric interconnection by the bonding wire 9 inevitably fails. As the epoxy resin employed for such a purpose is generally made conductive by admixing conductors such as silver, such a coverage of the interconnection lead 10 by the bleeding 8a causes a short circuit connection, even when the bonding of the wire 9 is made successful. It is believed that such an unpredictable occurrence of the bleeding 8 is caused by the microstructure of the ceramic forming the package such as alumina. The control of microstructure of alumina ceramic is not yet perfect in the presently available ceramic technology.

SUMMARY OF THE INVENTION

Accordingly, it is a general object of the present invention to provide a novel and useful semiconductor device having a ceramic package, wherein the foregoing problems are eliminated.

Another and more specific object of the present invention is to provide a semiconductor device having a ceramic package, wherein the problem of defective wire bonding between a semiconductor chip and an interconnection lead provided on the ceramic package, is minimized.

Another object of the present invention is to provide a semiconductor device having a ceramic package on which a semiconductor chip is mounted by a low cost resin, wherein the problem of bleeding of resin into the region of the package used for interconnection, is positively prevented.

Another object of the present invention is to provide a semiconductor device having a ceramic package on which a semiconductor chip is mounted by a low cost resin, wherein there is formed a zone of dense texture in the surface of the ceramic package between the semiconductor chip and the interconnection lead, for interrupting the bleeding of the resin therethrough from the semiconductor chip to the interconnection lead. According to the present invention, the bleeding of the resin used for die-bonding the semiconductor chip on the ceramic package is stopped at the zone of the dense and smooth surface texture, and the failure of wire-bonding between the semiconductor chip and the interconnection lead is eliminated, even when there is a variation in the texture of the ceramic package. It should be noted that such a region of dense and smooth surface texture generally has a reduced porosity. Even when there are pores, these pores are generally isolated and the penetration of the resin by the capillary action is prevented. Thereby, the yield of the semiconductor device fabrication is improved and the cost of the semiconductor device is reduced.

Other objects and further features of the present invention will become apparent from the following detailed description when read in conjunction with the attached drawings.

DETAILED DESCRIPTION

Figure 1:
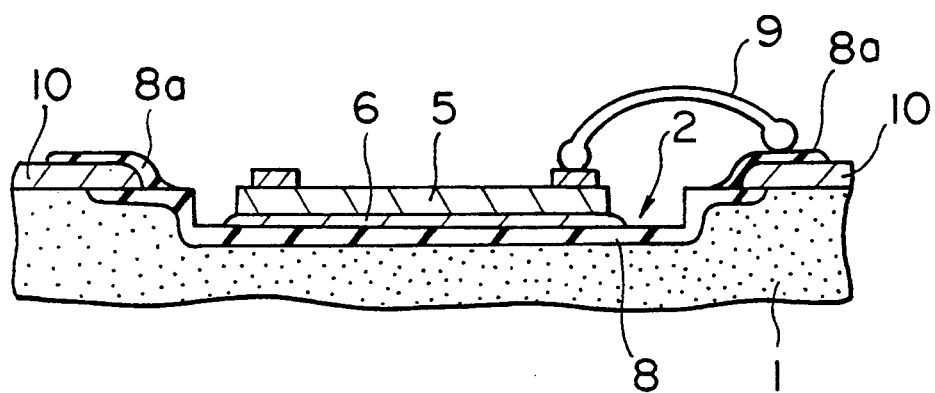
FIG. 1 is a diagram showing the bleeding occurred in a conventional ceramic package.
Figure 2:
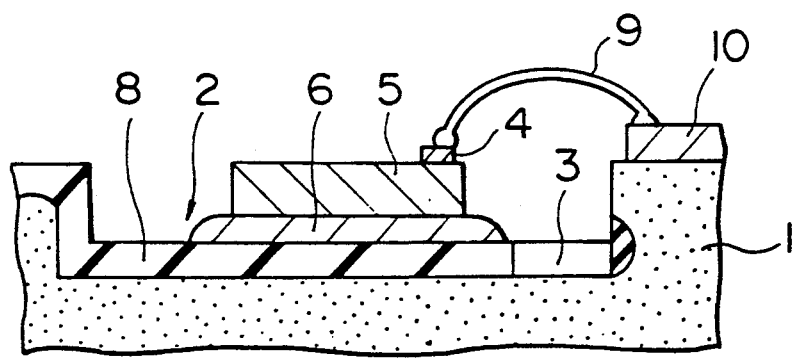
FIG. 2 is a diagram showing the principle of the present invention.

FIG. 2 shows the principle of the present invention. For the sake of comparison, the ceramic package of FIG. 2 is illustrated to have a structure substantially identical with the structure of FIG. 1 and the parts that correspond to the parts in FIG. 1 are designated by the same reference numerals.

Referring to FIG. 2, the ceramic package 1 is formed with a zone 3 wherein the surface texture is modified by melting. Such a melting of the zone 3 is achieved for example by the irradiation of a high power laser beam and is confined to a part within the stage part 2 and located between the chip 5 and the lead 10. As the zone 3 formed as such has a dense texture with reduced porosity, the capillary action of the resin is suppressed and the bleeding of the resin to the interconnection lead 10 as shown in FIG. 1 by a part 8a, is prevented effectively. As the bleeding of the resin occurs along the surface of the ceramic package 1, the depth of the zone 3 is not essential.

Figure 3A:
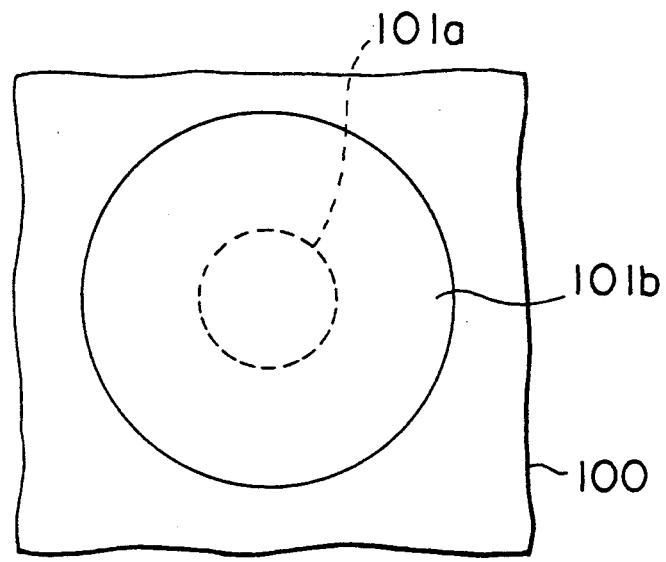
FIG. 3(A) and 3(B) are diagrams showing the effect of suppressing the bleeding achieved by the present invention in comparison with the conventional ceramic package.
Figure 3B:
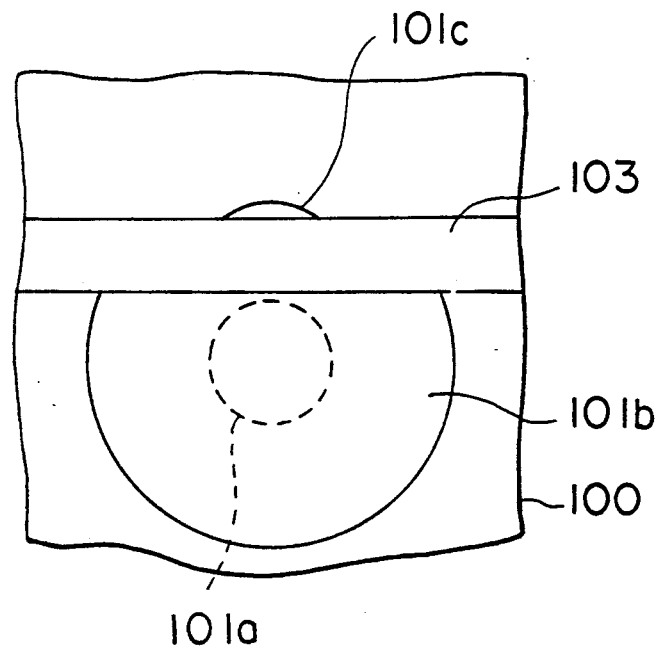

FIGS. 3(A) and 3(B) show the result of the experiment conducted for demonstrating the effect of suppression of the bleeding by the formation of the region of the modified surface texture.

Referring to FIG. 3(A), a ceramic plate 100 of alumina having the same quality as the alumina ceramic package 1 is prepared and an epoxy resin 101a is applied on the ceramic plate 100 generally in the circular form with a diameter of about 1.5 mm. After curing at 150° C., it was observed that the bleeding occurs as shown by a circular region 101b of which diameter is about 5.0 mm.

FIG. 3(B) shows the result for the case where a strip-like zone 103 of the modified surface texture is provided on the ceramic plate 100. Such a zone 103 is formed by an irradiation of the high power beam of a YAG laser with the oscillation wavelength of 1.06 μm, the oscillation current of 12 A and the oscillation frequency of 5 kHz. The zone 103 is formed with a width of about 1 mm by scanning the surface of the ceramic plate 100 with a speed of about 10 mm/sec. It was shown that, when the zone 103 is formed with the width of 1 mm or more, the bleeding of the resin beyond the strip-like zone 103 and forming a region 101c, is effectively suppressed as illustrated.

Next, a first embodiment of the present invention will be described with reference to FIGS. 4(A) and 4(B).

Figure 4A:
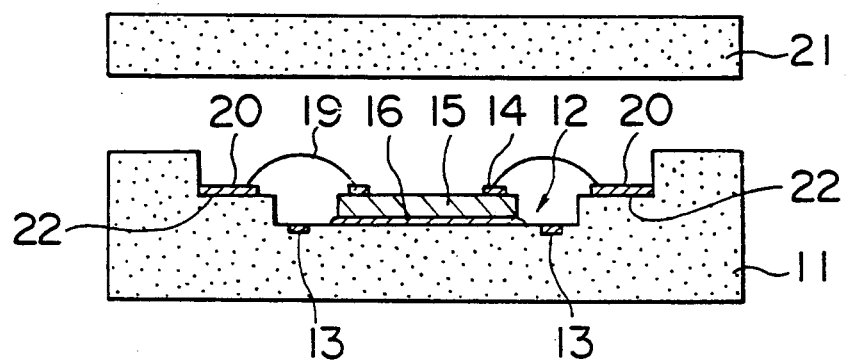
FIG. 4(A) and 4(B) are diagrams respectively showing the vertical cross sectional view and the plan view of a ceramic package according to a first embodiment of the present invention.
Figure 4B:
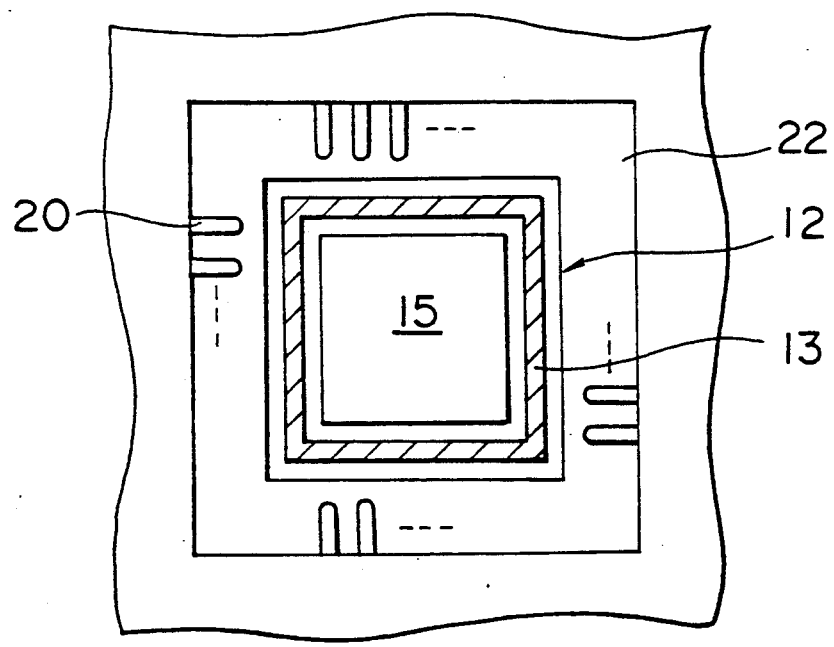

Referring to FIG. 4(A) showing the vertical cross section, the semiconductor device comprises a ceramic package 11 in which a depressed stage part 12 is formed. Further, a stepped part 22 is formed in the ceramic package 11 to surround the depressed stage part 12. On the stage part 12, a semiconductor chip 15 is bonded by a layer 16 of a conductive epoxy resin generally called "silver glass." Further, an interconnection lead 20 is provided on the stepped part 22 in electric connection to a bonding pad 14 on the chip 15 by a bonding wire 19. Further, the semiconductor chip 15 is protected by a ceramic lid 21 that is mounted on the ceramic package 11.

It should be noted that, in the structure of FIG. 4(A), there is provided a strip-like zone 13 of modified texture in the stage part 12 between the chip 15 and the stepped part 22. In the plan view of FIG. 4(B), it can be seen that the strip-like zone 13 extends to surround the chip 15 in the stage part 12 of the ceramic package 11. The zone 13 is formed by the irradiation of the high power laser beam such as the YAG layer as described previously, and has a glassy appearance indicating a dense, recrystallized texture of alumina.

Typically, the strip-like zone 13 has a width of 1 mm or more and extends into the ceramic package 11 with a depth of a few microns. Thereby, the bleeding of the epoxy resin 16 into the region 22 is prevented as already described. Of course, the region 13 is formed prior to the bonding of the semiconductor chip 15 on the stage part 12.

Figure 5:
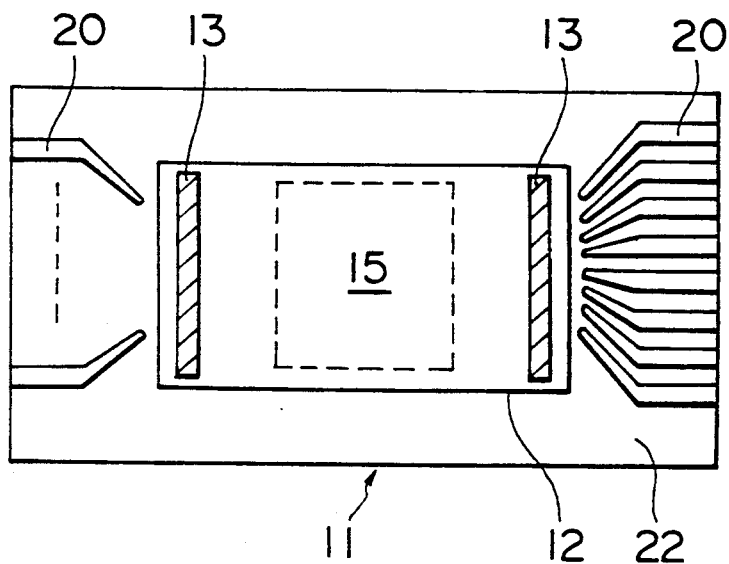
FIG. 5 is a diagram showing the plan view of a ceramic package according to a second embodiment of the present invention.

FIG. 5 shows a semiconductor package according to a second embodiment in the plan view. As the device of FIG. 5 has a vertical cross section identical with the structure of FIG. 4(A), only the plan view will be presented.

Referring to FIG. 5, the strip-like zone 13 is formed along two opposing edges of the stage part 12, instead of surrounding the semiconductor chip 15 completely.

As long as the zone 13 is provided between the chip 15 and the leads 20 on the stepped region 22, the desired effect of interrupting the bleeding of resin is achieved. In the device of FIG. 5, the fabrication process of the device is simplified by eliminating the unnecessary process for forming the zone 13 at the other opposing ends of the region 12.

FIGS. 6(A)–6(D) are diagrams showing the steps for fabricating the semiconductor device according to the present invention. The process of FIGS. 6(A)–6(D) is applicable both to the first embodiment of FIGS. 4(A) and 4(B) and the second embodiment of FIG. 5.

Figure 6A:
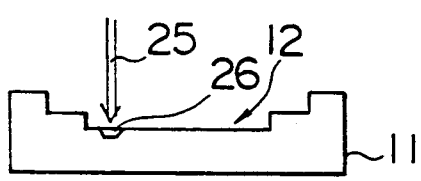
FIG. 6(A)–6(D) are diagrams showing the process for forming a region of modified surface texture that forms the essential part of the present invention, on the ceramic package by an irradiation of a laser beam.

Referring to the step of FIG. 6(A), a high power laser beam 25 is irradiated on the surface of the ceramic package 11 in correspondence to a region where the strip-like zone 13 is to be formed, and in response thereto, a molten region 26 is formed. The condition of the laser beam irradiation is described previously.

Figure 6B:
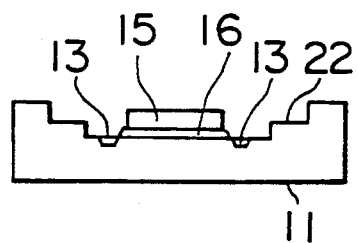

After interrupting the laser beam 25, the molten region 26 is solidified to form the zone 13 in which the texture of the ceramic is modified as already described. Next, the layer 16 of the conductive epoxy resin is applied on the stage part 12 of the package body 11 and the semiconductor chip 15 is mounted on the epoxy layer 16 of the stage part 12. Thereby a structure shown in FIG. 6(B) is obtained. Next, the structure thus obtained is heated at 150° C. for 60 minutes to cure the epoxy layer 16. As there is the zone 13 formed at both sides of the chip 15, the bleeding of the resin 16 beyond the zone 13 is prevented.

Figure 6C:
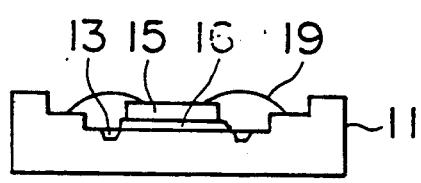
Figure 6D:
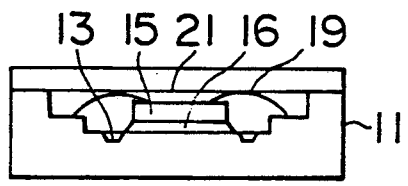

Next, in the step of FIG. 6(C), the electric connection between the semiconductor chip 15 and the interconnection leads 20 is established by the wire-bonding process. Further, in the step of FIG. 6(D), the ceramic package 11 is closed by providing the protective lid 21.

In the present invention, the formation of the zone 13 is not limited to the irradiation of the laser beam but any means that causes a localized melting of the surface of the ceramic package 11 may be employed. Further, the number of the strip-like zone 13 between the semiconductor chip 15 and the lead 10 is not limited to one, but a plurality of such zones 13 may be formed.

Further, the present invention is not limited to the embodiments described heretofore, but various variations and modifications may be made without departing from the scope of the invention.

What is claimed is:

1. A semiconductor device, comprising:
   a package body of a ceramic material formed with a stage region for supporting a semiconductor chip and an interconnection region used for external interconnection of the semiconductor device, said interconnection region being provided on a region that is separated from the stage region;
   a semiconductor chip mounted on the stage region of the package body by a layer of a resin that fixes the semiconductor chip on the stage region, said semiconductor chip having a bonding pad region for external interconnection;
   an interconnection lead provided on the interconnection region of the package body for external connection of the semiconductor device;
   an interconnection wire connecting the bonding pad region of the semiconductor chip and the interconnection lead electrically; and
   a zone of modified surface texture formed on a surface of the package body at a part located between the semiconductor chip and the interconnection region, said zone having a texture with increased density as compared to the rest of the package body.

2. A semiconductor device as claimed in claim 1 in which said texture of the zone is the one that is obtained when the ceramic material forming the package body is subjected to a recrystallization process after melting.

3. A semiconductor device as claimed in claim 1 in which said zone is formed to surround the semiconductor chip 4. A semiconductor device as claimed in claim 1 in which said zone has a width, measured in a direction connecting the semiconductor chip and the interconnection region, of at least 1 mm.

5. A method for forming a semiconductor device having a ceramic package, comprising the steps of:
irradiating a laser beam on a zone of a ceramic package body located between a stage part that is defined on the ceramic package body for mounting a semiconductor chip and an interconnection region that is defined on the ceramic package body at a part separated from the stage part for carrying a lead for an external connection of the semiconductor device, with an output power sufficient to melt a surface of the ceramic package such that the zone has a modified texture that is dense as compared to the rest of the ceramic package;
applying a resin layer on the stage part of the ceramic package body;
mounting a semiconductor chip on the stage the ceramic package body by the resin layer;
curing the resin layer; and
interconnecting a connection pad of the semiconductor chip to the lead on the interconnection region by a bonding wire.

6. A method as claimed in claim 5 in which said step of irradiating the laser beam is achieved such that the zone has a width, measured in a direction connecting the stage part and the interconnection region, of 1 mm or more.

* * * * *

UNITED STATES PATENT AND TRADEMARK OFFICE
CERTIFICATE OF CORRECTION

PATENT NO. : 5,091,770
DATED : February 25, 1992
INVENTOR(S) : Ichiro YAMAGUCHI

It is certified that error appears in the above-identified patent and that said Letters Patent is hereby corrected as shown below:

Title page, please enter the following:

[30]    Foreign Application Priority Data

May 18, 1990 [JP]    Japan ................... 2-129712

Col. 6, line 9, after "stage" insert --part such that the semiconductor chip is attached to--.

Signed and Sealed this

Twenty-second Day of February, 1994

Attest:

BRUCE LEHMAN

*Attesting Officer*    *Commissioner of Patents and Trademarks*